United States Patent [19]

Kim

[11] Patent Number: 5,331,733
[45] Date of Patent: Jul. 26, 1994

[54] METHOD FOR MANUFACTURING A CONNECTION DEVICE FOR A SEMICONDUCTOR DEVICE

[75] Inventor: Jae K. Kim, Kyungki, Rep. of Korea

[73] Assignee: Hyundai Electronics Industries Co., Ltd., Rep. of Korea

[21] Appl. No.: 793,819

[22] Filed: Nov. 18, 1991

[30] Foreign Application Priority Data

Nov. 21, 1990 [KR] Rep. of Korea .................. 90-18854

[51] Int. Cl.$^5$ .................. H01K 3/10; H01L 21/312
[52] U.S. Cl. .................. 29/852; 156/656; 156/657; 156/659.1; 156/662
[58] Field of Search .................. 29/852; 437/190, 195; 156/656, 657, 659.1, 662

[56] References Cited

U.S. PATENT DOCUMENTS

| | | | |
|---|---|---|---|
| 5,008,216 | 4/1991 | Huang et al. | 437/195 |
| 5,010,039 | 4/1991 | Ku et al. | 437/228 |
| 5,169,802 | 12/1992 | Yeh | 156/657 |

Primary Examiner—P. W. Echols
Assistant Examiner—David P. Bryant
Attorney, Agent, or Firm—Ladas & Parry

[57] ABSTRACT

A method for electrically connecting an internal wired layer through an insulating layer formed on the internal wired layer is described and comprises depositing a first conducting layer 1 on a substrate 10. An internal wired layer 1A is formed by etching a portion of the first conducting layer 1 utilizing a mask A. A first insulating layer 2 is deposited on the entire surface of the resulting structure. A second conducting layer 3 is deposited on the first insulating layer 2. An etch stop layer 3A is formed on the first insulating layer 2 and terminates on the first insulating layer and over the wired layer to define a surface of the wired layer covered by the etch stop layer and a surface of the wired layer not covered by the etch stop layer. A second insulating layer 4 is deposited on the entire surface of the resulting structure including on the etch stop layer 3A. A contact hole 20 is formed through the second insulating layer 4 and the first insulating layer 2 to expose the surface of the underlying wired layer not covered by the etch stop layer such that the etch stop covered surface of the wired layer remains covered by the overlying first insulating layer. A third conducting layer 5 for a predetermined purpose is deposited on the resulting structure including the contact hole for electrically connecting the wired layer 1A thereto.

4 Claims, 2 Drawing Sheets

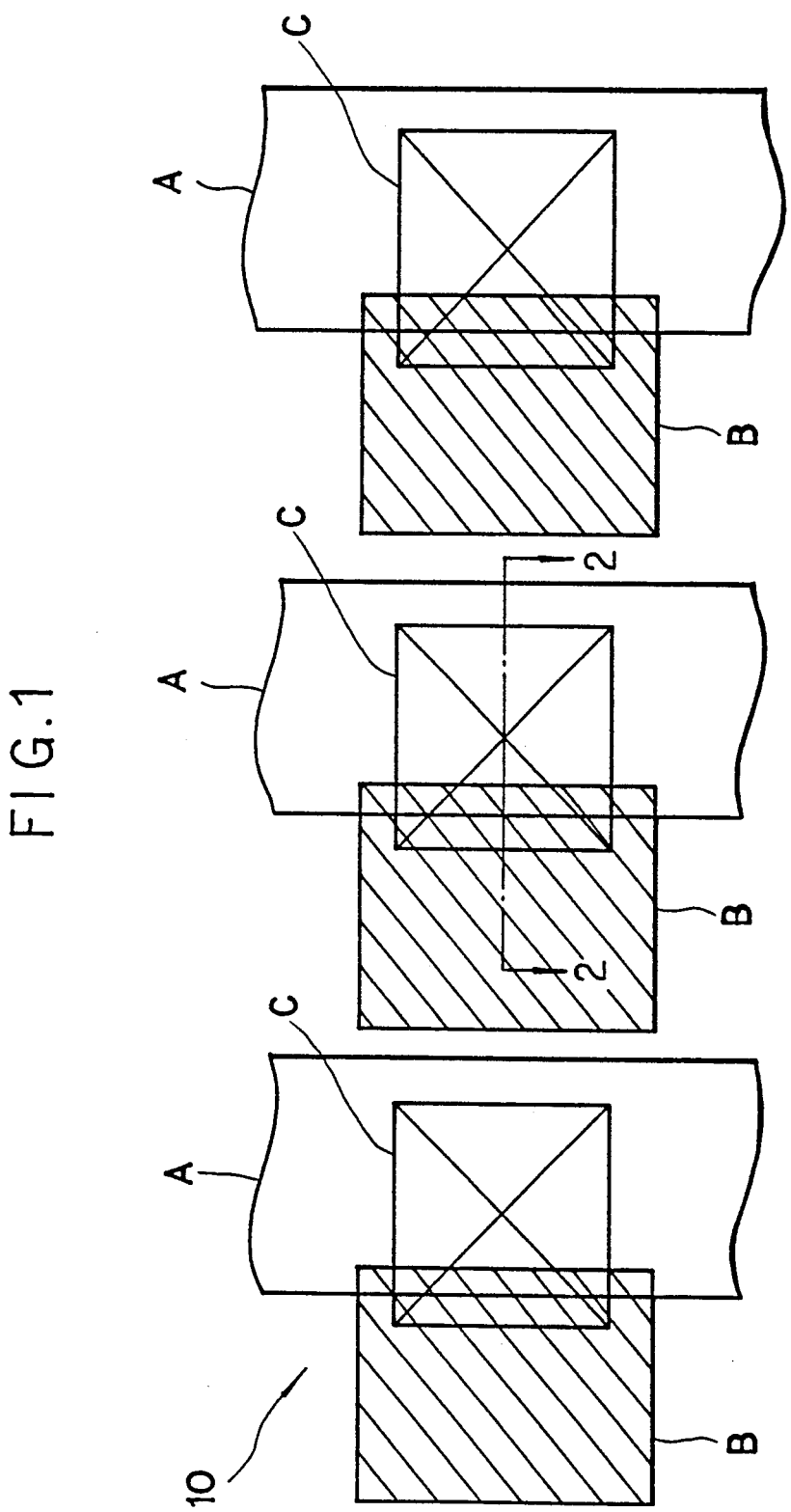

METHOD FOR MANUFACTURING A CONNECTION DEVICE FOR A SEMICONDUCTOR DEVICE

BACKGROUND OF INVENTION

1. Field of the Invention

The invention relates to a connection device in a semiconductor device and a method for forming the connection, and more particularly, to a connection device which accurately electrically connects a conducting layer to an internal wired layer on a silicon substrate and where the wired layer has a line width which is the minimally attainable width utilizing present lithographic etching process techniques.

2. Information Disclosure Statement

Generally, in manufacturing an integrated circuit semiconductor device, in order to electrically connect a conducting layer through an insulating layer to an internal wired layer deposited on a substrate, a portion of the insulating layer formed on the internal wired layer should be precisely etched to define a contact region which exposes only the surface of the underlying internal wired layer. Therefore, the contact region for forming a contact hole through which an electrical connection is accomplished should be retained by precisely arranging a contact mask at a predetermined position in accordance with design rules for the semiconductor device. Furthermore, the width of the underlying internal wired layer to which the conducting layer is to be connected should be greater than the bore/width of the contact hole considering the minimum misalignment tolerance required for the mask patterning process for the internal wired layer and the critical dimension loss which occurs during the lithographic etching process. If the width of the contact hole is either larger than that of the internal wired layer or is the same as that of the internal wired layer, and the contact mask arranged on the insulating layer for forming the contact hole is misaligned, the resulting etched contact hole is also misaligned which exposes unintended portions of the underlying substrate. Therefore when a conducting layer is deposited on the resulting structure including the exposed portion of the substrate, the conducting layer is undesirably connected through the misaligned contact hole to the exposed portion of the substrate, so that the semiconductor device fails to operate as designed.

Therefore, according to the prior art, in order to form a contact hole for connecting a conducting layer through the contact hole to the underlying internal wired layer formed on the substrate, the width of the wired layer should be larger than that of the contact hole, so that the problems set forth above can be avoided or at least minimized. However upon increasing the width of the wired layer, the cell width of the resulting semiconductor device is undesirably increased so that integrity of semiconductor device decreases.

Accordingly, it is an object of the present invention to solve the problems set forth above in the prior art, and to provide a connection device in a semiconductor device by providing an etch stop layer on an insulating layer at a position overlapping with one side of the underlying internal wired layer, and forming a contact hole in the insulating layer in a position from the portion of the etch stop layer to the portion of the wired layer, and depositing a conducting layer on the resulting structure to electrically connect the conducting layer through the contact hole to the wired layer, so that an electrical connection therebetween is desirably accomplished, although the resulting contact hole is misaligned during the contact mask patterning process, and a method for manufacturing the same.

According to the present invention the etching process for forming the contact hole prevents the underlying substrate from being exposed by the formation process of the contact hole so that the conducting layer to be deposited is desirably connected through even a misaligned contact hole to the wired layer having a line width which is the minimally attainable width utilizing present lithographic etching process techniques formed on the substrate. Further, because of the use of the minimally attainable width of the wired layer the area of the resulting semiconductor can be decreased so that the integrity thereof increases.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The connection device in a semiconductor device and a method for manufacturing the device of the present invention is defined by the claims with a specific embodiment shown in the attached drawings. For the purpose of summarizing the invention, the invention relates to a method for electrically connecting an internal wired layer through an insulating layer formed on the internal wired layer. The method comprises depositing a first conducting layer 1 on a substrate 10 and forming an internal wired layer 1A by etching a portion of the first conducting layer 1 utilizing a mask A. A first insulating layer 2 is deposited on the entire surface of the resulting structure including the internal wired layer. A second conducting layer 3 is deposited on the first insulating layer 2. An etch stop layer 3A is formed on the first insulating layer 2 and which terminates on the first insulating layer and over the wired layer to define a surface of the wired layer covered by the etch stop layer and a surface of the wired layer not covered by the etch stop layer. A second insulating layer 4 is deposited on the entire surface of the resulting structure including on the etch stop layer 3A. A contact hole 20 is formed through the second insulating layer 4 and the first insulating layer 2 to expose the surface of the underlying wired layer not covered by the etch stop layer such that the etch stop covered surface of the wired layer remains covered by the overlying first insulating layer. A third conducting layer 5 for a predetermined purpose is deposited on the resulting structure including the contact hole for electrically connecting the wired layer 1A thereto thereby forming a connection device for a semiconductor device.

Preferably, the etch stop layer 3A is formed by etching the second conducting layer 3 utilizing a mask layer B and the contact hole 20 is formed by sequentially removing portions of the second insulating layer 4 and the first insulating layer 2 utilizing a contact mask C.

A further embodiment of the present invention includes a connection device for use in a semiconductor device. The connection device comprises a first conducting layer 1 deposited on a substrate 10 with an internal wired layer 1A positioned on the first conducting layer 1. A first insulating layer 2 is deposited on the entire surface of the resulting structure including the internal wired layer. An etch stop layer 3A is positioned on the first insulating layer 2 and terminates on the first insulating layer over the first conducting layer to define a surface of the first conducting layer covered by the etch stop layer and a surface of the first conducting layer uncovered by the etch stop layer. A second insulating layer 4 is positioned on the entire surface of the resulting structure including the etch stop layer 3A, A contact hole 20 is formed through the second insulating layer 4 and the first insulating layer 2 to expose only the uncovered surface of the underlying wired layer such that the covered surface of the first conducting layer remains covered by the first insulating layer. A third conducting layer 5 electrically connects the wired layer 1A through the contact hole to thereby form a connection device for a semiconductor device.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which:

FIG. 1 illustrates a layout arranging a plurality of masks for manufacturing a connection device in a semiconductor according to the present invention.

Similar reference characters refer to similar parts throughout the several views of the drawings.

DETAILED DESCRIPTION OF THE INVENTION

FIG. 1 represents a layout arranging a plurality of the masks for manufacturing the connection device according to the present invention in which wired layer masks A, etch stop layer masks B overlapped with the masks A for internal wired layer and contact masks C defined from the overlapped portions of the masks B to the masks A are arranged on a substrate 10. Here, the line width of internal wired layers formed by the masks A, which will be described hereinafter, is the minimal line width attainable in utilizing the present day lithographic etching process. Therefore, according to the layout mentioned above, if a contact hole is formed utilizing the contact mask C which is overlapped with the mask B as shown, it prevents the underlying substrate 10 from being undesirably exposed due to the misalignment of the contact mask C during the contact mask patterning process.

FIGS. 2A through 2D illustrate a sectional views for manufacturing the connection device taken along the line 2—2 of FIG. 1.

Figure 2A:
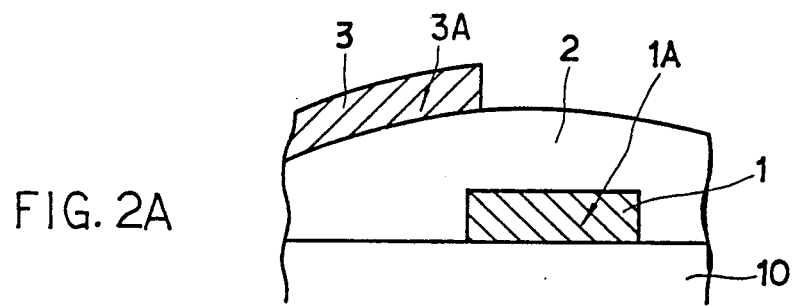
FIGS. 2A through 2D illustrate sectional views for manufacturing a connection device for manufacturing the connection device according to the present invention.

Referring to FIG. 2A, a first conducting layer 1 is deposited on a substrate 10, and an internal wired layer 1A is formed by removing a portion of the first conducting layer utilizing the mask A. A first insulating layer 2 is deposited on the entire surface of the resulting structure. A second conducting layer 3, for example a silicon layer, is deposited thereon. As shown in FIG. 1, an etch stop layer 3A is formed by removing a portion of the second conducting layer 3 utilizing the mask B a portion of which overlapped with the mask A. Therefore, the resultant etch stop layer 3A is formed on the first insulating layer at a position overlapped with the edge of the underlying wired layer 1A, as shown in the drawing.

Figure 2B:
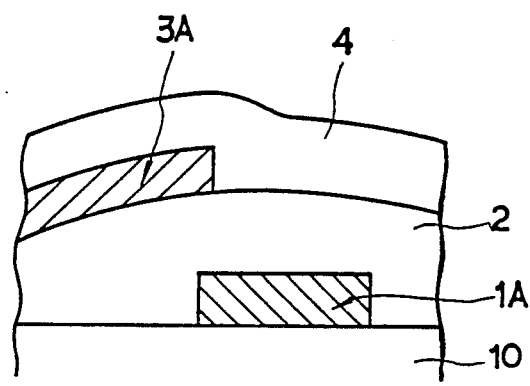

FIG. 2B represents that the second insulating layer 4 is deposited on the entire surface of the resulting structure including the etch stop layer 3A. It is noted that the process step for depositing the second insulating layer 4 is optional and can be omitted.

Figure 2C:
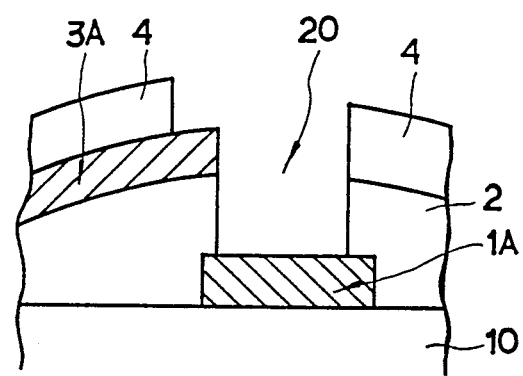

FIG. 2C represents that the contact hole 20 is formed by sequentially removing portions of the second insulating layer 4 and first insulating layer 2 utilizing the contact mask C the arrangement of which fully described in connection with FIG. 1, so that the edge portion of the etch stop layer and the surface of the underlying wired layer 1A is exposed. Referring to the drawing, it can be appreciated that the upper width of the contact hole 20 can be obtained in the minimal line width attainable in presently used lithographic etching process, but the lower width of the contact hole 20 can be formed with a decreased width relative to the upper width thereof. Therefore, if the contact hole 20 is unintentionally misaligned during the formation process, the presence of the etch stop layer prevents the underlying substrate 10 from being exposed.

Figure 2D:
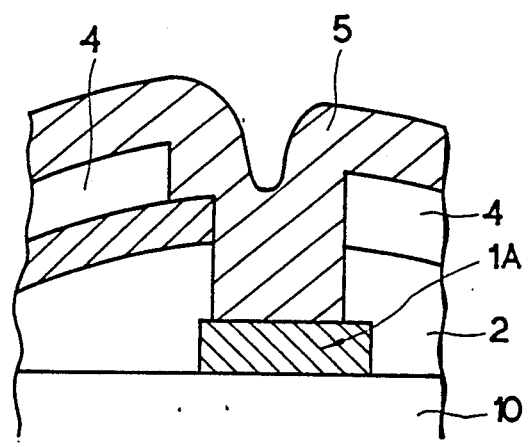

Referring to FIG. 2D, a third conducting layer 5 for a predetermined purpose is deposited on the resulting structure in connection with FIG. 2C, so that the third conducting layer 5 is desirably connected through the misaligned contact hole to the intended wired layer 1A to form a connection device 30 for semiconductor device.

As described above, according to the present invention, the electrical connection between the conducting layer and the internal wired layer having the minimal line width is accomplished through the undesirably misaligned contact hole, so that the area of the contact region can be minimized to increase the integrity of the semiconductor device.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for electrically connecting an internal wired layer of a semiconductor device with an external conducting layer of the semiconductor device through an insulating layer formed on the internal wired layer, the method comprising:

depositing a first conducting layer 1 on a substrate 10;

forming an internal wired layer 1A by etching a portion of the first conducting layer 1 utilizing a wired layer mask A and thereby exposing a portion of the substrate not covered by the internal wired layer 1A;

depositing a first insulating layer 2 on the exposed substrate and the internal wired layer 1A;

depositing a second conducting layer 3 on the first insulating layer 2;

forming from the second conducting layer 3 an etch stop layer 3A on the first insulating layer 2, said etch stop layer 3A terminating on the first insulating layer and over the wired layer to define a surface of the wired layer covered by the etch stop layer and a surface of the wired layer not covered by the etch stop layer;

forming a contact hole 20 through the first insulating layer 2 to expose the surface of the underlying wired layer not covered by the etch stop layer such that the etch stop layer covered surface of the wired layer remains covered by the overlying first insulating layer; and depositing a third conducting layer 5 on the first insulating layer, and into the contact hole formed in the first insulating layer 2, for electrically connecting the wired layer 1A with the third conducting layer 5, thereby forming a connection device for the semiconductor device.

2. The method of claim 1 wherein the etch stop layer 3A is formed by etching the second conducting layer 3 utilizing an etch stop layer mask B.

3. A method for electrically connecting an internal wired layer of a semiconductor device with an external conducting layer of the semiconductor device through an insulating layer formed on the internal wired layer, the method comprising:

depositing a first conducting layer 1 on a substrate 10;

forming an internal wired layer 1A by etching a portion of the first conducting layer 1 utilizing a wired layer mask A and thereby exposing a portion of the substrate not covered by the internal wired layer 1A;

depositing a first insulating layer 2 on the exposed substrate and the internal wired layer 1A;

depositing a second conducting layer 3 on the first insulating layer 2;

forming from the second conducting layer 3 an etch stop layer 3A on the first insulating layer 2, said etch stop layer terminating on the first insulating layer and over the wired layer to define a surface of the wired layer covered by the etch stop layer and a surface of the wired layer not covered by the etch stop layer;

depositing a second insulating layer 4 on the etch stop layer and the first insulating layer;

forming a contact hole 20 through the second insulating layer 4 and the first insulating layer 2 to expose the surface of the underlying wired layer not covered by the etch stop layer such that the etch stop covered surface of the wired layer remains covered by the overlying first insulating layer; and depositing a third conducting layer 5 on the second insulating layer, and into the contact hole formed in the second insulating layer 4 and the first insulating layer 2, to electrically connect the wired layer 1A with the third conducting layer 5, thereby forming a connection device for the semiconductor device.

4. The method of claim 3 wherein the contact hole 20 is formed by sequentially removing portions of the second insulating layer 4 and the first insulating layer 2 utilizing a contact mask C.

* * * * *